(12) United States Patent
Pan et al.

(10) Patent No.: US 7,605,461 B2
(45) Date of Patent: Oct. 20, 2009

(54) CHIP PACKAGE STRUCTURE

(75) Inventors: Yu-Tang Pan, Tainan County (TW);
Shih-Wen Chou, Tainan County (TW)

(73) Assignee: ChipMOS Technologies Inc., Hsinchu (TW)

( * ) Notice: Subject to any disclaimer, the term of this patent is extended or adjusted under 35 U.S.C. 154(b) by 204 days.

(21) Appl. No.: 11/755,753

(22) Filed: May 31, 2007

(65) Prior Publication Data

US 2008/0246131 A1 Oct. 9, 2008

(30) Foreign Application Priority Data

Apr. 3, 2007 (TW) .............................. 96111756 A

(51) Int. Cl.
*H01L 23/02* (2006.01)
(52) U.S. Cl. .............................. 257/692; 257/E23.168; 257/E23.169
(58) Field of Classification Search ................. 257/694, 257/700, 723, 678, 690
See application file for complete search history.

(56) References Cited

U.S. PATENT DOCUMENTS 5,367,196 A * 11/1994 Mahulikar et al. .......... 257/787
5,757,070 A * 5/1998 Fritz ........................... 257/675
5,793,108 A * 8/1998 Nakanishi et al. ........... 257/723
6,900,528 B2 * 5/2005 Mess et al. .................. 257/686

* cited by examiner

*Primary Examiner*—Zandra Smith
*Assistant Examiner*—Paul E Patton
(74) *Attorney, Agent, or Firm*—Jianq Chyun IP Office

(57) ABSTRACT

A chip package structure including a circuit pattern, a frame, a first adhesive layer, a plurality of leads, an insulating adhesive layer, a chip, a plurality of first bonding wires, a plurality of second bonding wires, and a molding compound is provided. The frame and leads are disposed around the circuit pattern. The first adhesive layer fastens the frame and the circuit pattern. The insulating adhesive layer is disposed between the leads and the frame. The chip has a plurality of bonding pads and is disposed on the first adhesive layer. The first bonding wires electrically connect the bonding pads individually to the circuit pattern. The second bonding wires electrically connect the leads individually to the circuit pattern. Thus, the bonding pads are electrically connected with the leads through the first bonding wires, the circuit pattern, and the second bonding wires. The molding compound covers foregoing components.

15 Claims, 6 Drawing Sheets

CHIP PACKAGE STRUCTURE

CROSS-REFERENCE TO RELATED APPLICATION

This application claims the priority benefit of Taiwan application serial no. 96111756, filed on Apr. 3, 2007. All disclosure of the Taiwan application is incorporated herein by reference.

BACKGROUND OF THE INVENTION

1. Field of the Invention

The present invention generally relates to a semiconductor device, in particular, to a chip package structure having a circuit pattern.

2. Description of Related Art

In the semiconductor industry, the fabrication of integrated circuits (ICs) mainly comprises three phases: IC design, IC process, and IC package.

In the fabrication of an IC, a chip is fabricated through wafer process, IC formation, and wafer sawing etc. A wafer has an active surface which generally refers to the surface of the wafer having active devices. After the IC in the wafer is completed, the active surface of the wafer is further disposed with a plurality of bonding pads, so that those chips eventually formed by sawing the wafer can be electrically connected to a carrier through these bonding pads. The carrier may be a lead frame or a package substrate and may have a plurality of contacts. A chip can be connected to the contacts through wire bonding or flip chip bonding so that the bonding pads of the chip can be electrically connected to the leads to form a chip package structure.

While bonding the bonding pads and the contacts through bonding wires, the electrically connected bonding pads and contacts usually have to be located at the same side of the chip in order to shorten the bonding distance. Accordingly, the dispositions of the bonding pads and the leads are restricted and the circuit layout becomes inflexible. Besides, since the leads and the chip are connected only by the bonding wires, the heat produced by the chip cannot be effectively conducted to the surroundings, therefore the heat dissipation performance of the chip package structure is not satisfactory.

SUMMARY OF THE INVENTION

Accordingly, the present invention is directed to a chip package structure having flexible dispositions of bonding pads and leads.

The present invention provides a chip package structure including a circuit pattern, a frame, a first adhesive layer, a plurality of leads, an insulating adhesive layer, a chip, a plurality of first bonding wires, a plurality of second bonding wires, and a molding compound. The frame and the leads are disposed around the circuit pattern, wherein the frame and the circuit pattern may be formed from the same metal layer. The first adhesive layer fastens the circuit pattern and the frame and exposes a part of the circuit pattern. The insulating adhesive layer is disposed between the leads and the frame for fastening the leads and the frame. The chip has a plurality of bonding pads and is disposed on the first adhesive layer. The first bonding wires electrically connect the bonding pads individually to the circuit pattern. The second bonding wires electrically connect the leads individually to the circuit pattern. The bonding pads are electrically connected with the leads through the first bonding wires, the circuit pattern, and the second bonding wires. The molding compound covers the circuit pattern, the frame, the first adhesive layer, parts of the leads, the insulating adhesive layer, the chip, the first bonding wires, and the second bonding wires.

According to an embodiment of the present invention, the leads are disposed on the frame.

According to an embodiment of the present invention, the frame is a metal layer.

According to an embodiment of the present invention, the first adhesive layer is disposed on the circuit pattern and the frame.

According to an embodiment of the present invention, the chip package structure further includes a second adhesive layer disposed below the circuit pattern and the frame.

According to an embodiment of the present invention, the chip package structure further includes a heat sink fastened below the second adhesive layer.

According to an embodiment of the present invention, the first adhesive layer extends through the circuit pattern, and a part of the first adhesive layer is located between the chip and the circuit pattern, and another part of the first adhesive layer is located below the circuit pattern.

According to an embodiment of the present invention, the chip package structure further includes a heat sink fastened on the first adhesive layer below the circuit pattern.

The present invention further provides another chip package structure including a circuit pattern, a frame, a first adhesive layer, a plurality of leads, an insulating adhesive layer, a first chip, a plurality of first bonding wires, a plurality of second bonding wires, at least one second chip, a plurality of third bonding wires, and a molding compound. The frame and the leads are disposed around the circuit pattern. The first adhesive layer fastens the circuit pattern and the frame and exposes a part of the circuit pattern. The insulating adhesive layer is disposed between the leads and the frame for fastening the leads and the frame. The first chip has a plurality of first bonding pads and is disposed on the first adhesive layer. The first bonding wires electrically connect the first bonding pads individually to the circuit pattern. The second bonding wires electrically connect the leads to the circuit pattern. The first bonding pads are electrically connected with the leads through the first bonding wires, the circuit pattern, and the second bonding wires. The second chip is disposed above the first chip and exposes the first bonding pads. The second chip has a plurality of second bonding pads, and the third bonding wires electrically connect the second bonding pads individually to the first bonding pads. The molding compound covers the circuit pattern, the frame, the first adhesive layer, parts of the leads, the insulating adhesive layer, the chips, the first bonding wires, the second bonding wires, and the third bonding wires.

According to an embodiment of the present invention, the first bonding pads are located at one side of the first chip, and the second bonding pads are located at one side of the second chip close to the first bonding pads.

According to an embodiment of the present invention, the first and the second bonding wires are located at one side of the first chip.

According to an embodiment of the present invention, the first and the second bonding wires are located at two sides of the first chip.

According to an embodiment of the present invention, the first adhesive layer is disposed on the circuit pattern and the frame.

According to an embodiment of the present invention, the chip package structure further includes a second adhesive layer disposed below the circuit pattern and the frame.

According to an embodiment of the present invention, the chip package structure further includes a third chip, a plurality of fourth bonding wires, and a plurality of fifth bonding wires. The third chip is disposed below the second adhesive layer and has a plurality of third bonding pads. The fourth bonding wires electrically connect the third bonding pads individually to the circuit pattern. The fifth bonding wires electrically connect the leads individually to the circuit pattern. The third bonding pads are electrically connected with the leads through the fifth bonding wires, the circuit pattern, and the fourth bonding wires.

According to an embodiment of the present invention, the chip package structure further includes at least one fourth chip and a plurality of sixth bonding wires. The fourth chip is disposed below the third chip and exposes the third bonding pads, and the fourth chip has a plurality of fourth bonding pads. The sixth bonding wires electrically connect the fourth bonding pads individually to the third bonding pads.

According to an embodiment of the present invention, the chip package structure further includes a heat sink fastened below the second adhesive layer.

According to an embodiment of the present invention, the first adhesive layer passes through the circuit pattern, and a part of the first adhesive layer is located between the first chip and the circuit pattern, and another part of the first adhesive layer is located below the circuit pattern.

According to an embodiment of the present invention, the chip package structure further includes a third chip, a plurality of fourth bonding wires, and a plurality of fifth bonding wires. The third chip is disposed on the first adhesive layer below the circuit pattern and has a plurality of third bonding pads. The fourth bonding wires electrically connect the third bonding pads individually to the circuit pattern. The fifth bonding wires electrically connect the leads individually to the circuit pattern. The third bonding pads are electrically connected with the leads through the fifth bonding wires, the circuit pattern, and the fourth bonding wires.

According to an embodiment of the present invention, the chip package structure further includes at least one fourth chip and a plurality of sixth bonding wires. The fourth chip is disposed below the third chip and exposes the third bonding pads, and the fourth chip has a plurality of fourth bonding pads. The sixth bonding wires electrically connect the fourth bonding pads individually to the third bonding pads.

According to an embodiment of the present invention, the chip package structure further includes a heat sink fastened on the first adhesive layer below the circuit pattern.

As described above, in the present invention, a chip is disposed on a circuit pattern and the circuit pattern serves as a connecting point of wiring, thus the dispositions of bonding pads and leads become more flexible. Moreover, since the leads are directly disposed on the frame, the heat produced by the chip can be directly conducted to the leads, and accordingly the heat dissipation performance of the chip package structure can be improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
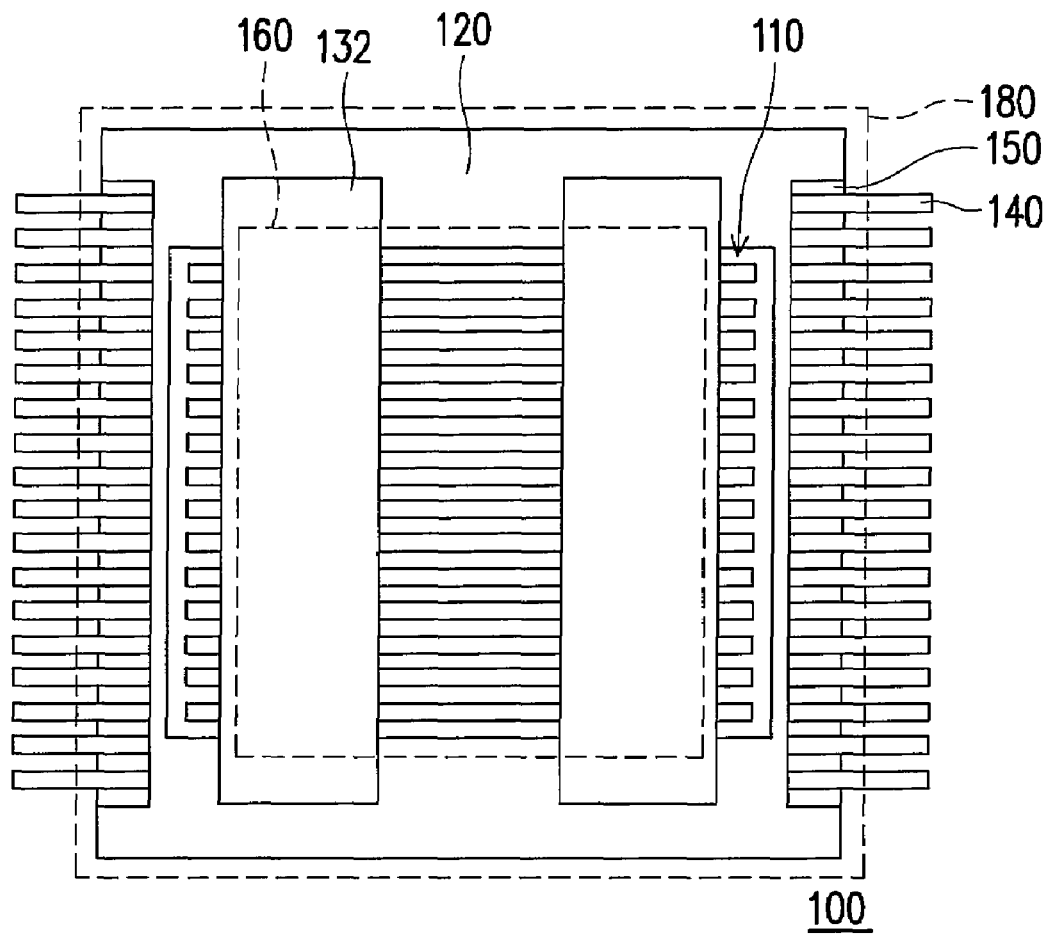
FIG. 1A is a front elevational view of a chip package structure according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 1B:
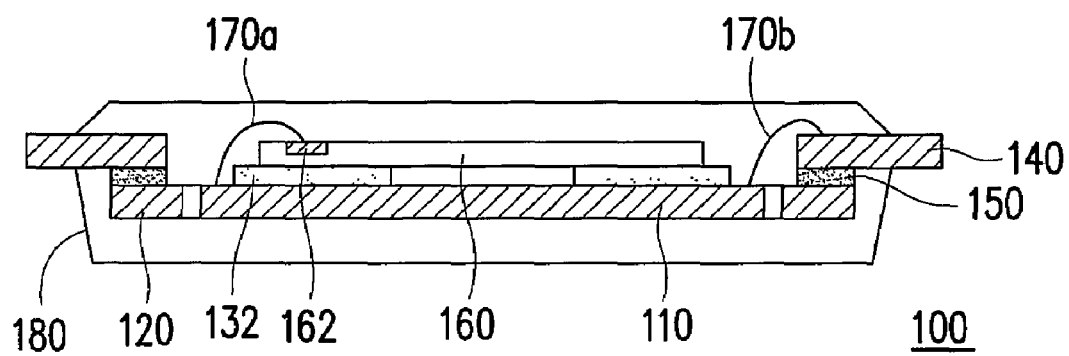
FIG. 1B is a cross-sectional view of the chip package structure in FIG. 1A.

FIG. 1A is a front elevational view of a chip package structure according to a first embodiment of the present invention, and FIG. 1B is a cross-sectional view of the chip package structure in FIG. 1A. Referring to FIG. 1A and FIG. 1B, the chip package structure 100 includes a circuit pattern 110, a frame 120, a first adhesive layer 132, a plurality of leads 140, an insulating adhesive layer 150, a chip 160, a plurality of first bonding wires 170*a*, a plurality of second bonding wires 170*b*, and a molding compound 180.

The frame 120 may be a metal layer, and the frame 120 and the circuit pattern 110 may be formed from the same metal layer. The frame 120 is fastened around the circuit pattern 110 by the first adhesive layer 132, and the first adhesive layer 132 exposes a part of the circuit pattern 110, wherein the first adhesive layer 132 may be an adhesive tape. The chip 160 is disposed on the first adhesive layer 132. The first bonding wires 170*a* electrically connect the bonding pads 162 on the chip 160 and the part of the circuit pattern 110 exposed by the first adhesive layer 132 respectively. The second bonding wires 170*b* electrically connect the leads 140 individually to the circuit pattern 110. The bonding pads 162 are electrically connected with the leads 140 through the first bonding wires 170*a*, the second bonding wires 170*b*, and the circuit pattern 110. The leads 140 are disposed around the circuit pattern 110. In the present embodiment, the leads 140 may be fastened on the frame 120 through the insulating adhesive layer 150, wherein the material of the insulating adhesive layer 150 may be an insulating and heat-dissipating adhesive material. The leads 140 are not limited to foregoing disposition and which may also be disposed somewhere else, for example, around the frame 120. The molding compound 180 covers the circuit pattern 110, the frame 120, the first adhesive layer 132, parts of the leads 140, the insulating adhesive layer 150, the chip 160, the first bonding wires 170a, and the second bonding wires 170b.

In the present embodiment, the bonding pads 162 are located at one side of the chip 160, and the first bonding wires 170a and the second bonding wires 170b are respectively located at two sides of the chip 160. To be specific, the first bonding wires 170a electrically connect the bonding pads 162 to one side of the circuit pattern 110, and the second bonding wires 170b electrically connect the leads 140 to the other side of the circuit pattern 110. In other words, the bonding pads 162 and the leads 140 connected to the bonding pads 162 are located at two sides of the chip 160. In addition, the bonding pads 162 and the leads 140 connected to the bonding pads 162 may also be disposed differently.

Figure 1C:
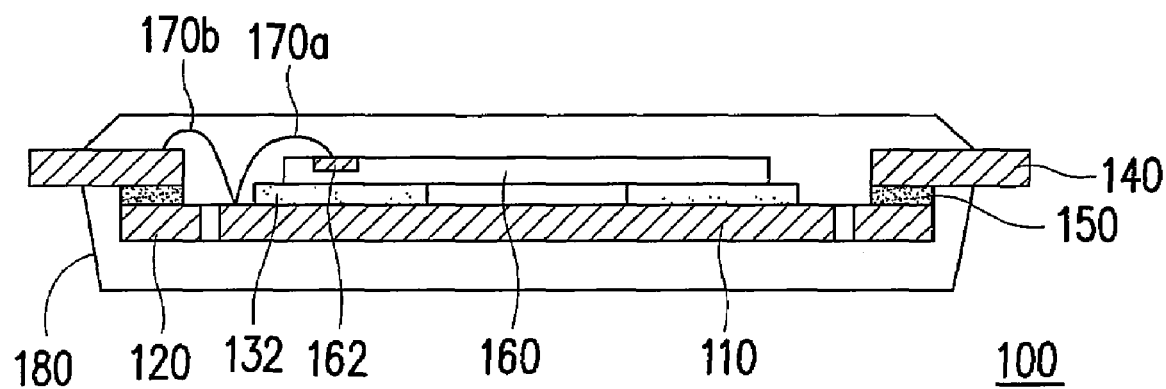
FIG. 1C is a cross-sectional view illustrating another disposition of the first bonding wires and the second bonding wires in the first embodiment of the present invention.
Figure 1D:
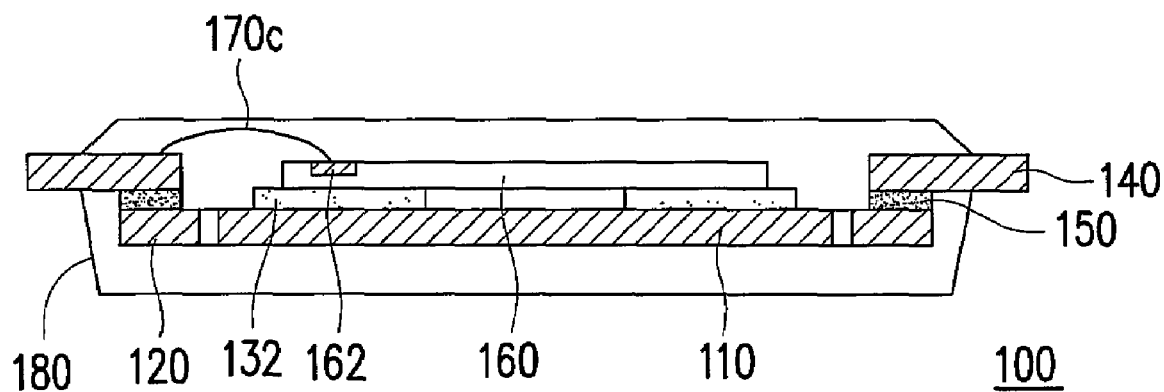
FIG. 1D is a cross-sectional view illustrating another connection between the bonding pads and the leads in the first embodiment of the present invention.

FIG. 1C is a cross-sectional view illustrating another disposition of the first and the second bonding wires in the first embodiment of the present invention, and FIG. 1D is a cross-sectional view illustrating another connection between the bonding pads and the leads in the first embodiment of the present invention. Referring to FIG. 1C and FIG. 1D, in FIG. 1C, the bonding pads 162 and the leads 140 connected to the bonding pads 162 are located at the same side of the circuit pattern 110, while in FIG. 1D, the chip package structure 100b further includes a third lead 170c which directly connects the bonding pads 162 and the leads 140.

Because the chip package structure 100 has a circuit pattern 110, the bonding pads 162 and the leads 140 connected to the bonding pads 162 may be located at the same side or two different sides of the chip 160. In other words, in the present embodiment, the signal transmission path is changed by the circuit pattern 110 so that the dispositions of the bonding pads 162 and the leads 140 can be more flexible. In addition, because the leads 140 are disposed on the frame 120 through an insulating and heat-dissipating adhesive material, the heat produced by the chip 160 can be directly conducted to the leads 140 via the frame 120, and accordingly the heat dissipation performance of the chip package structure 100 can be improved.

Second Embodiment

Figure 2:
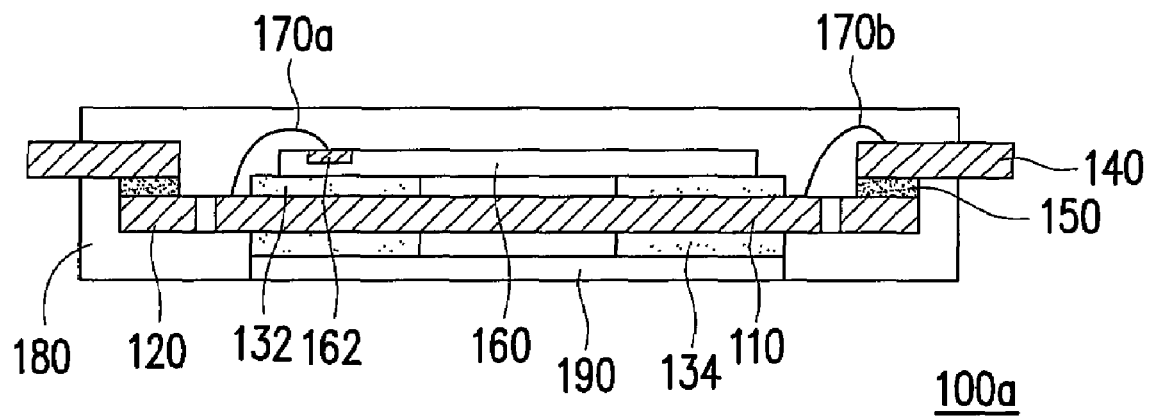
FIG. 2 is a cross-sectional view of a chip package structure according to a second embodiment of the present invention.

FIG. 2 is a cross-sectional view of a chip package structure according to a second embodiment of the present invention. The second embodiment is similar to the first embodiment, and in these two embodiments, like reference numerals refer to like elements. Only the difference between the two embodiments will be described in details below.

Figure 3:
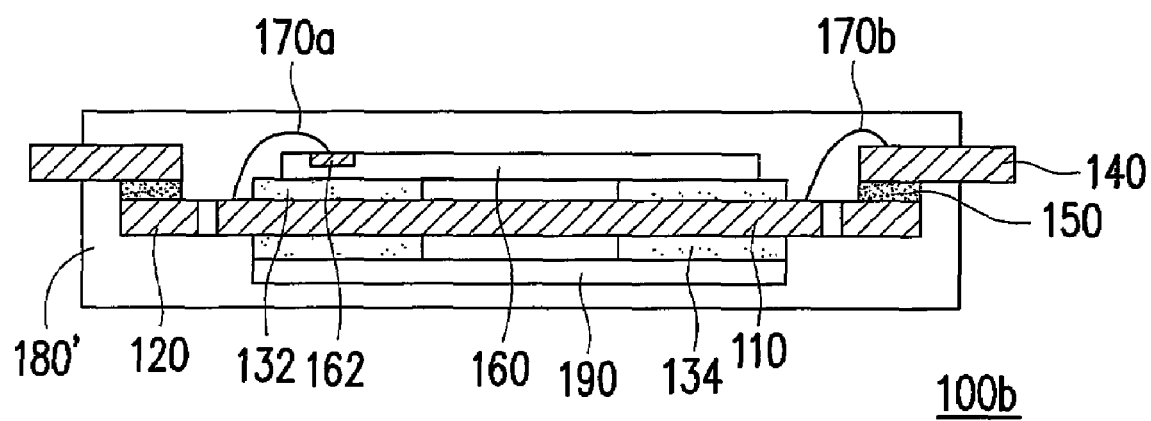
FIG. 3 is a cross-sectional view illustrating another disposition of the molding compound in the second embodiment of the present invention.

Referring to FIG. 2, in the present embodiment, the chip package structure 100a has a second adhesive layer 134 disposed below the circuit pattern 110 and the frame 120, and the second adhesive layer 134 may also be an adhesive tape as the first adhesive layer 132. Besides, the chip package structure 100a may further include a heat sink 190 fastened below the second adhesive layer 134 so that the heat produced by the chip 160 can be directly conducted to the heat sink 190 through the frame 120. In the present embodiment, the heat sink 190 is exposed by the molding compound 180, but those skilled in the art, however, may also dispose the heat sink 190 differently. FIG. 3 is a cross-sectional view illustrating another disposition of the molding compound in the second embodiment of the present invention. Referring to FIG. 3, the molding compound 180 covers the heat sink 190.

Third Embodiment

Figure 4A:
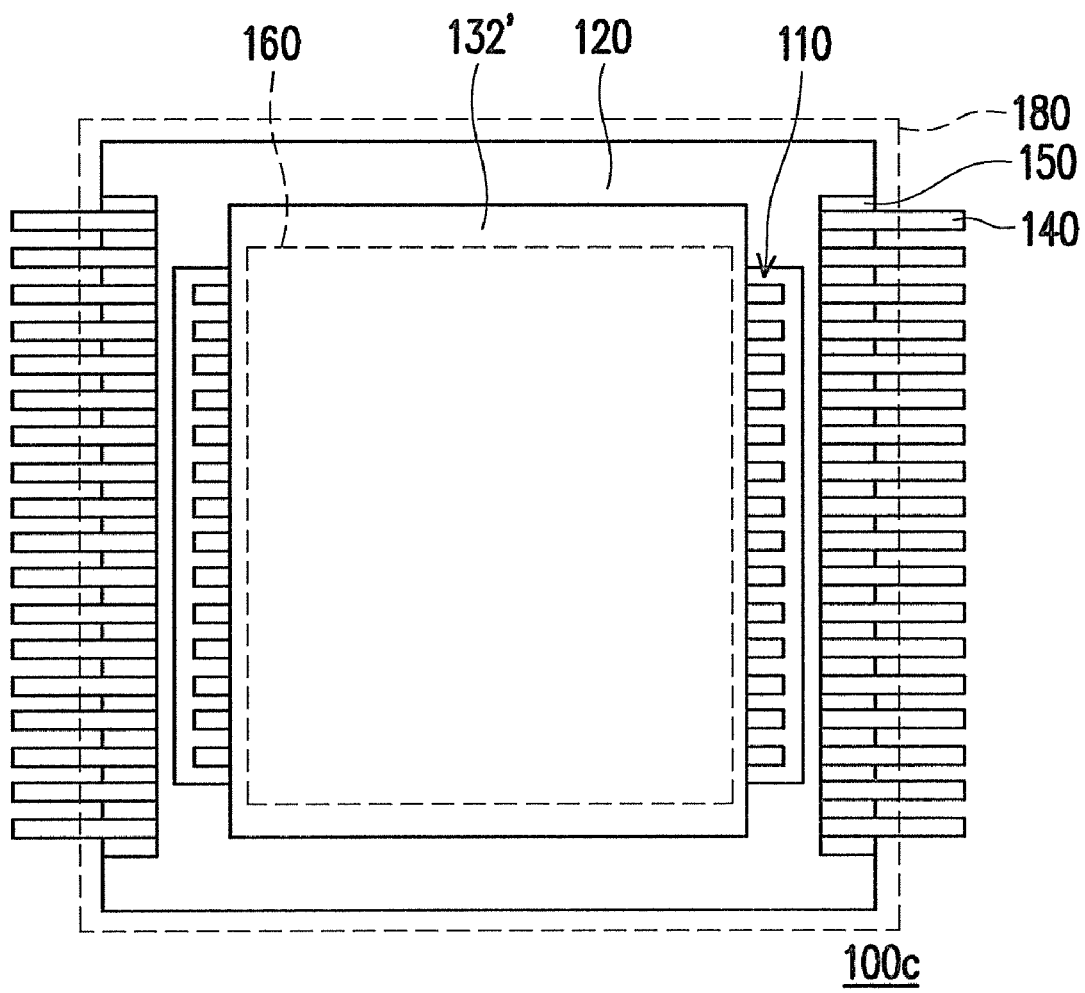
FIG. 4A is a front elevational view of a chip package structure according to a third embodiment of the present invention.
Figure 4B:
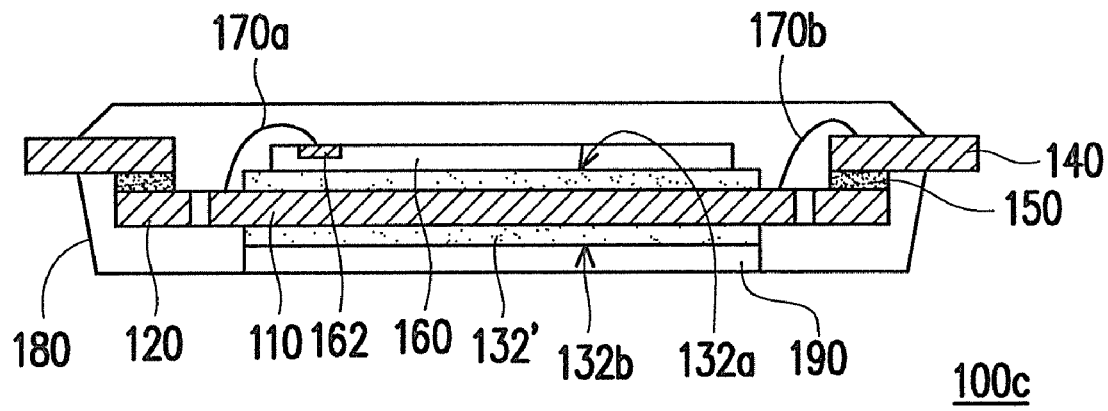
FIG. 4B is a cross-sectional view of the chip package structure in FIG. 4A.

FIG. 4A is a front elevational view of a chip package structure according to a third embodiment of the present invention, and FIG. 4B is a cross-sectional view of the chip package structure in FIG. 4A. The third embodiment is similar to the first embodiment, and in these two embodiments, like reference numerals refer to like elements. Only the difference between the two embodiments will be described in details below.

Figure 5:
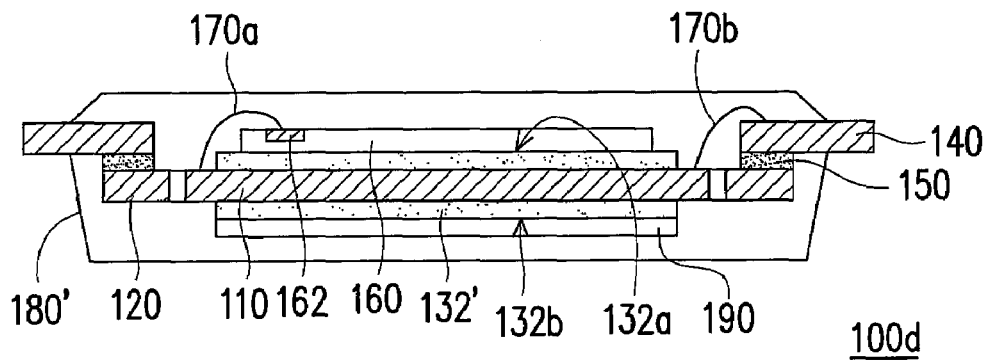
FIG. 5 is a cross-sectional view illustrating another disposition of the molding compound in the third embodiment of the present invention.

Referring to FIG. 4A and FIG. 4B, the first adhesive layer 132' of the chip package structure 1 00b may be an adhesive glue layer or a solder mask layer. The first adhesive layer 132' extends through the circuit pattern 110 and covers both sides of the circuit pattern 110 and the frame 120, and the first adhesive layer 132' exposes a part of the circuit pattern 110. In the present embodiment, the chip package structure 100b may also include a heat sink 190. The heat sink 190 is disposed on the first adhesive layer 132' below the circuit pattern 110, and the molding compound 180 exposes a part of the heat sink 190. The molding compound 180 in the present embodiment may also be disposed differently. FIG. 5 is a cross-sectional view illustrating another disposition of the molding compound in the third embodiment of the present invention. Referring to FIG. 5, the molding compound 180 of the chip package structure 100b does not expose the heat sink 190. Instead, it covers the heat sink 190.

Fourth Embodiment

Figure 6:
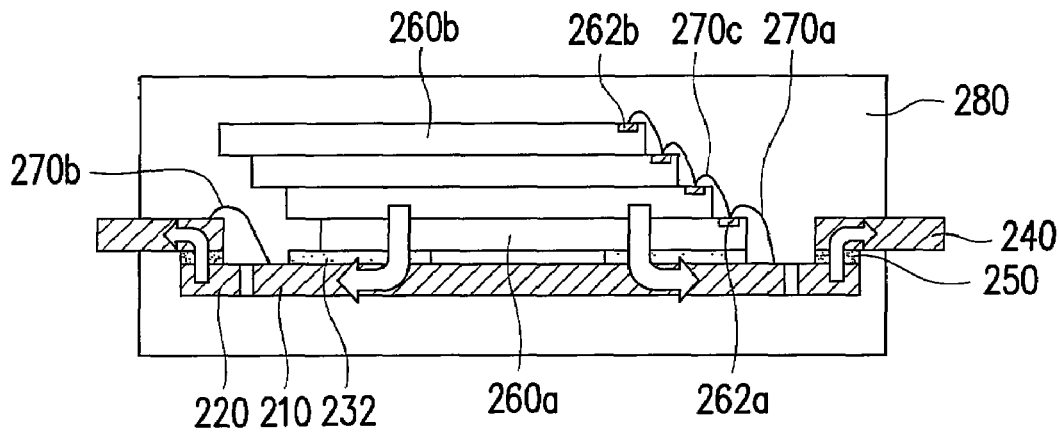
FIG. 6 is a cross-sectional view of a chip package structure according to a fourth embodiment of the present invention.

FIG. 6 is a cross-sectional view of a chip package structure according to a fourth embodiment of the present invention. The fourth embodiment is similar to the first embodiment, and in these two embodiments, like reference numerals refer to like elements. Only the difference between the two embodiments will be described in details below.

Referring to FIG. 6, in the chip package structure 200 of the present embodiment, a first chip 260a having a plurality of first bonding pads 262a is disposed on a first adhesive layer 232, and a plurality of second chips 260b are disposed on the first chip 260a and exposes the first bonding pads 262a. The chip package structure 200 further includes a plurality of third bonding wires 270c. The second chips 260b has a plurality of second bonding pads 262b electrically connected to the first bonding pads 262a through the third bonding wires 270c. It should be noted that even though multiple second chips 260b are illustrated in FIG. 6, the number of the second chips 260b is not limited in the present invention, and those skilled in the art may also dispose other number of second chips 260b, for example, only one second chip 260b.

Fifth Embodiment

Figure 7:
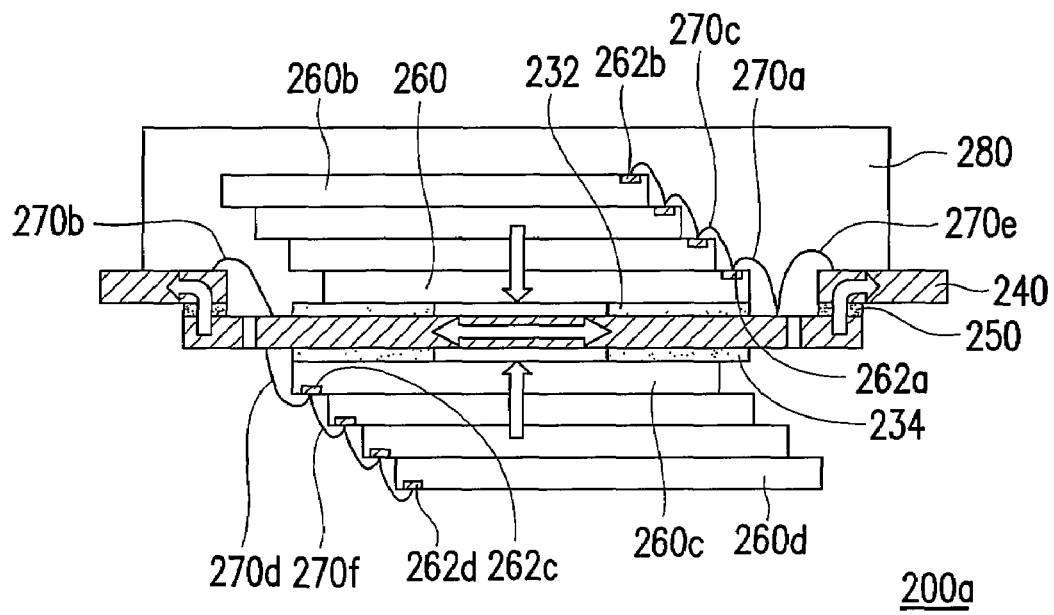
FIG. 7 is a cross-sectional view of a chip package structure according to a fifth embodiment of the present invention.

FIG. 7 is a cross-sectional view of a chip package structure according to a fifth embodiment of the present invention. The fifth embodiment is similar to the fourth embodiment, and in these two embodiments, like reference numerals refer to like elements. Only the difference between the two embodiments will be described in details below.

In the present embodiment, the chip package structure 200a further includes a third chip 260c, a plurality of fourth bonding wires 270d, and a plurality of fifth bonding wires 270e. The third chip 260c is disposed on the second adhesive layer 234 and has a plurality of third bonding pads 262c. The fourth bonding wires 270d electrically connect the third bonding pads 262c individually to the circuit pattern 210. The fifth bonding wires 270e electrically connect the leads 240 individually to the circuit pattern 210. The third bonding pads 262c are electrically connected with the leads 240 through the fourth bonding wires 270d, the fifth bonding wires 270e, and the circuit pattern 210. In addition, the chip package structure 200a may further include a plurality of fourth chips 260d and a plurality of sixth bonding wires 270f. The fourth chips 260d have a plurality of fourth bonding pads 262d. The fourth chips 260d are disposed on the third chip 260c and expose the third bonding pads 262c. The sixth bonding wires 270f electrically connect the third bonding pads 262c and the fourth bonding pads 262d.

It should be noted that even though multiple fourth chips 260d are illustrated in FIG. 7, the number of the fourth chips 260d is not limited by the present embodiment, and other number of fourth chips 260d may also be disposed, for example, only one fourth chip 260d. In addition, the dispositions of the fourth bonding wires 270d and the fifth bonding wires 270e are not restricted herein either, and which may also be disposed at the same side of the third chip 260c.

Sixth Embodiment

Figure 8:
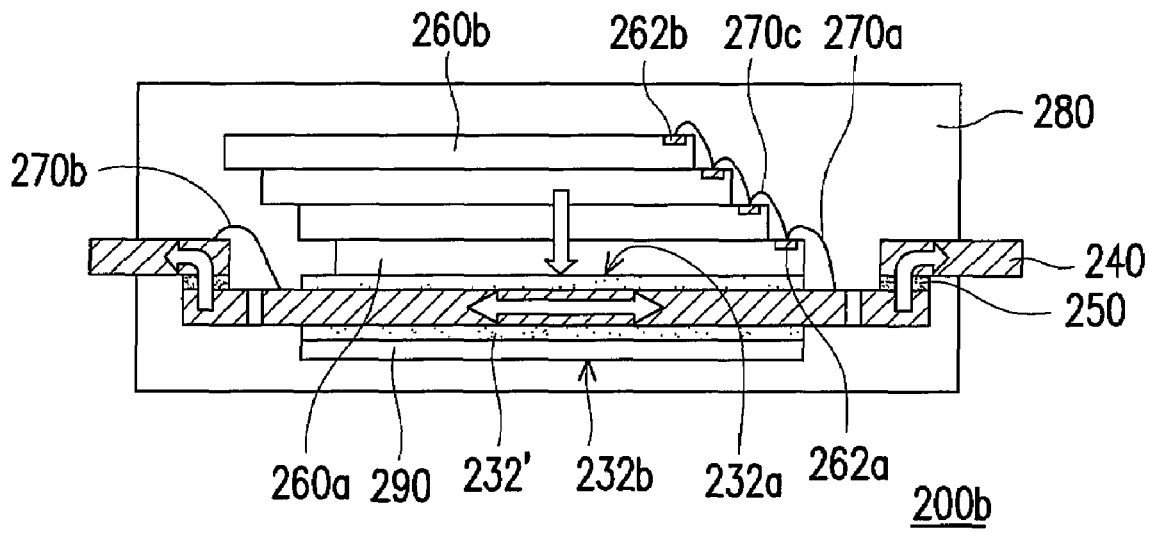
FIG. 8 is a cross-sectional view of a chip package structure according to a sixth embodiment of the present invention.

FIG. 8 is a cross-sectional view of a chip package structure according to a sixth embodiment of the present invention. The sixth embodiment is similar to the fourth embodiment, and in these two embodiments, like reference numerals refer to like elements. Only the difference between the two embodiments will be described in details below.

In the present embodiment, the first adhesive layer 232' may be an adhesive glue layer or a solder mask layer. The first adhesive layer 232' extends through the circuit pattern 210 and covers both sides of the circuit pattern 210 and the frame 220, and the first adhesive layer 232' exposes a part of the circuit pattern 210. In the present embodiment, the chip package structure 200b may further include a heat sink 290 disposed on the first adhesive layer 232' below the circuit pattern 210, and the molding compound 280 exposes a part of the heat sink 290. It should be noted that even though the molding compound 280 covers the heat sink 290 in FIG. 8, the molding compound 280 may also expose a part of the heat sink 290 as in the third embodiment.

Seventh Embodiment

Figure 9:
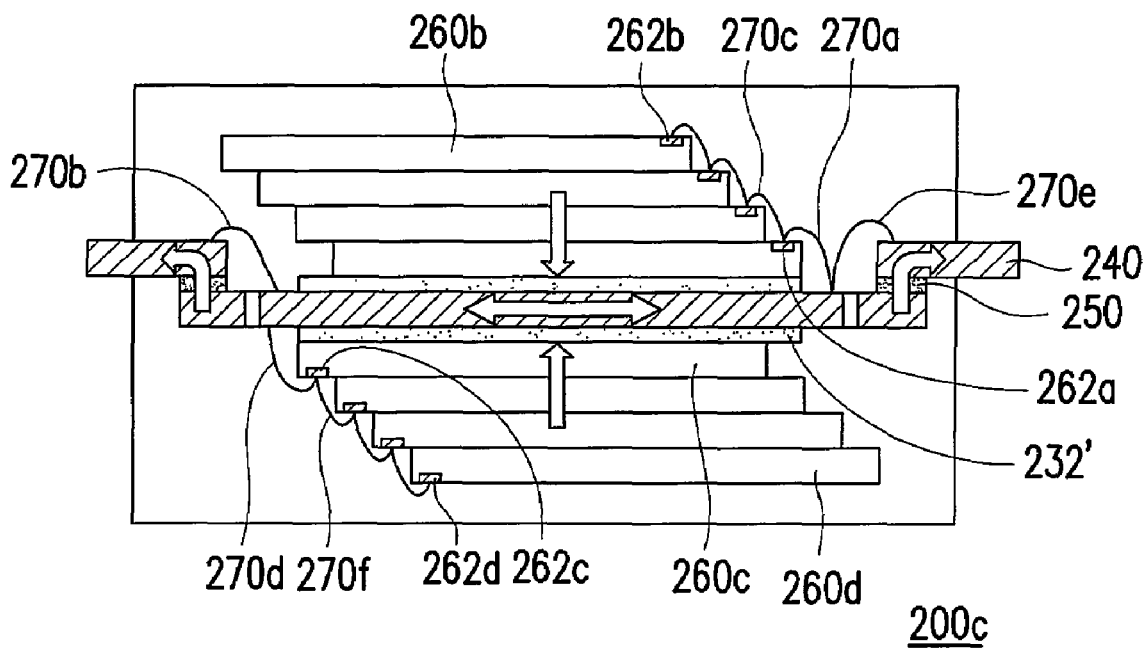
FIG. 9 is a cross-sectional view of a chip package structure according to a seventh embodiment of the present invention.

FIG. 9 is a cross-sectional view of a chip package structure according to a seventh embodiment of the present invention. The seventh embodiment is similar to the fifth embodiment, and in these two embodiments, like reference numerals refer to like elements. Only the difference between the two embodiments will be described in details below.

In the present embodiment, the first adhesive layer 232' may be an adhesive glue layer or a solder mask layer. The first adhesive layer 232' passes through the circuit pattern 210 and covers both sides of the circuit pattern 210 and the frame 220, and the first adhesive layer 232' exposes a part of the circuit pattern 210. The first chip 260a is disposed on the first adhesive layer 232' above the circuit pattern 210, and the third chip 260c is disposed on the first adhesive layer 232' below the circuit pattern 210.

It should be noted that in foregoing second to seventh embodiments, the first bonding wires and the second bonding wires may be disposed differently as the first bonding wires 170a and the second bonding wires 170b in the first embodiment. For example, the first bonding wires and the second bonding wires may be disposed at the same side or two different sides of the chip. In other words, the bonding pads and the leads connected to the bonding pads may be located at the same side or two different sides of the chip. Besides, in foregoing embodiments, the bonding pads and the leads may also be directly connected by a lead as illustrated in FIG. 1D.

In summary, in the present invention, a circuit pattern is adopted for changing the signal transmission path, namely, the bonding pads and the leads connected to the bonding pads are located at two sides of a chip. Or, the circuit pattern serves as the connecting point of wiring, namely, the bonding pads and the leads connected to the bonding pads are located at the same side of the chip. Thus, the dispositions of the bonding pads and the leads become very flexible. Moreover, one or multiple chips may be fastened on a surface or two opposite surfaces of the circuit pattern through an adhesive layer to form stacked chips. Furthermore, since the circuit pattern has high heat conduction coefficient, the heat produced by the chip can be directly conducted to the leads through the frame, and accordingly the heat dissipation performance of the chip package structure can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
a circuit pattern;
a frame, surrounding the circuit pattern;
a first adhesive layer, formed on the circuit pattern and the frame to fasten the circuit pattern and the frame together and exposing a part of the circuit pattern;
a plurality of leads, disposed around the circuit pattern;
an insulating adhesive layer, disposed between the leads and the frame to attach the leads to the frame;
a chip, mounted upon the circuit pattern with the first adhesive layer, the chip having a plurality of bonding pads;
a plurality of first bonding wires, electrically connecting the bonding pads individually to the circuit pattern;
a plurality of second bonding wires, electrically connecting the leads individually to the circuit pattern, the bonding pads being electrically connected with the leads through the first bonding wires, the circuit pattern, and the second bonding wires; and
a molding compound, covering the circuit pattern, the frame, the first adhesive layer, parts of the leads, the insulating adhesive layer, the chip, the first bonding wires, and the second bonding wires.

2. The chip package structure according to claim 1, wherein the leads are disposed on the frame.

3. The chip package structure according to claim 1, wherein the frame is a metal layer.

4. The chip package structure according to claim 1 further comprising a second adhesive layer disposed below the circuit pattern and the frame.

5. The chip package structure according to claim 4 further comprising a heat sink fastened below the second adhesive layer.

6. A chip package structure, comprising:
a circuit pattern;
a frame, surrounding the circuit pattern;

a first adhesive layer, formed on the circuit pattern and the frame to fasten the circuit pattern and the frame together and exposing a part of the circuit pattern;

a plurality of leads, disposed around the circuit pattern;

an insulating adhesive layer, disposed between the leads and the frame to attach the leads to the frame;

a first chip, mounted upon the circuit pattern with the first adhesive layer, the first chip having a plurality of first bonding pads;

a plurality of first bonding wires, electrically connecting the first bonding pads individually to the circuit pattern;

a plurality of second bonding wires, electrically connecting the leads individually to the circuit pattern, the first bonding pads being electrically connected with the leads through the first bonding wires, the circuit pattern, and the second bonding wires;

at least one second chip, disposed above the first chip and exposing the first bonding pads, the second chip having a plurality of second bonding pads;

a plurality of third bonding wires, electrically connecting the second bonding pads individually to the first bonding pads; and a molding compound, covering the circuit pattern, the frame, the first adhesive layer, parts of the leads, the insulating adhesive layer, the chips, the first bonding wires, the second bonding wires, and the third bonding wires.

7. The chip package structure according to claim 6, wherein the first bonding pads are located at one side of the first chip, and the second bonding pads are located at one side of the second chip close to the first bonding pads.

8. The chip package structure according to claim 6, wherein the first bonding wires and the second bonding wires are located at one side of the first chip.

9. The chip package structure according to claim 6, wherein the first bonding wires and the second bonding wires are located at two sides of the first chip.

10. The chip package structure according to claim 6 further comprising a second adhesive layer disposed below the circuit pattern and the frame.

11. The chip package structure according to claim 10 further comprising:
    a third chip, disposed below the second adhesive layer, the third chip having a plurality of third bonding pads;
    a plurality of fourth bonding wires, electrically connecting the third bonding pads individually to the circuit pattern; and
    a plurality of fifth bonding wires, electrically connecting the leads individually to the circuit pattern, the third bonding pads being electrically connected with the leads through the fifth bonding wires, the circuit pattern, and the fourth bonding wires.

12. The chip package structure according to claim 11 further comprising:
    at least one fourth chip, disposed below the third chip and exposing the third bonding pads, the fourth chip having a plurality of fourth bonding pads; and
    a plurality of sixth bonding wires, electrically connecting the fourth bonding pads individually to the third bonding pads.

13. The chip package structure according to claim 10 further comprising a heat sink fastened below the second adhesive layer.

14. The chip package structure according to claim 1, wherein the circuit pattern and the frame are coplanar.

15. The chip package structure according to claim 6, wherein the circuit pattern and the frame are coplanar.

* * * * *